United States Patent [19]

Olsson et al.

[11] Patent Number: 5,327,155

[45] Date of Patent: Jul. 5, 1994

[54] DEVICE FOR DISPLAYING A PARAMETER VALUE

[75] Inventors: Sven-Gunnar Olsson, Arloev; Mats Iderup, Lund; Goeran Rydgren, Bunkeflostrand; Goeran Cewers, Lund, all of Sweden

[73] Assignee: Siemens Aktiengesellschaft, Munich, Fed. Rep. of Germany

[21] Appl. No.: 956,288

[22] Filed: Oct. 5, 1992

[30] Foreign Application Priority Data

Oct. 4, 1991 [SE] Sweden .............................. 9102883-7

[51] Int. Cl.$^5$ ............................................. G09G 3/14
[52] U.S. Cl. ....................................... 345/39; 345/46; 345/82; 345/140
[58] Field of Search ............... 340/762, 782, 753, 754, 340/722, 825.03; 345/46, 82, 35, 39, 40, 140, 206

[56] References Cited

U.S. PATENT DOCUMENTS

| | | | |
|---|---|---|---|
| 3,868,638 | 2/1975 | Johnson | 340/147 R |
| 4,159,648 | 7/1979 | Prosky | 73/362 |
| 4,413,314 | 11/1983 | Slater et al. | 340/706 |
| 4,458,540 | 7/1984 | Little et al. | 340/754 |
| 4,570,160 | 2/1986 | Imazeki et al. | 340/789 |
| 4,689,615 | 8/1987 | Del Rosso | 340/721 |
| 4,745,298 | 5/1988 | Iwamatsu | 340/825.03 |
| 4,745,543 | 5/1988 | Michener et al. | 340/754 |
| 4,782,338 | 11/1988 | Barshinger | 340/754 |
| 4,978,951 | 12/1990 | Knapp | 340/719 |

FOREIGN PATENT DOCUMENTS

| | | |
|---|---|---|
| 0086619 | 8/1983 | European Pat. Off. . |
| 0273995 | 7/1988 | European Pat. Off. . |
| 0010964 | 1/1985 | Japan ................................. 340/782 |
| 433535 | 5/1984 | Sweden . |

OTHER PUBLICATIONS

"Three-Colour LED Display Panel Design," Electronic Engineering, vol. 57, No. 697, Jan. 1985, p. 29.
Swedish Article "New Possibilities to Indicate Using a Control Circuit for Light Emitting Diode Rows," El-teknik med, aktuell elektronik, vol. 17, No. 56, May--June, 1974 (Ed. B), p. 16.

Primary Examiner—Richard Hjerpe
Assistant Examiner—Lun-Yi Lao
Attorney, Agent, or Firm—Hill, Steadman & Simpson

[57] ABSTRACT

A device for displaying a parameter value has at least one row of light-emitting diodes in which each light-emitting diode has a position input, and the device has a control circuit with address outputs connected to the position inputs. Faults, such as a short-circuit can be detected more easily by an improved interconnection of the address outputs and position inputs such that two adjacent address outputs are connected to two position inputs physically separated by at least one position input.

16 Claims, 3 Drawing Sheets

DEVICE FOR DISPLAYING A PARAMETER VALUE

BACKGROUND OF THE INVENTION

1. Field of the Invention

The invention relates to a device for displaying a parameter value, of the type having at least one row of light-emitting diodes each having a position input, and a control circuit with address outputs connected to the position inputs, whereby a signal sent from the control circuit through an address output connected to a specific light-emitting diode's position input causes illumination of that light-emitting diode.

2. Description of the Prior Art

Devices of the type described above are known for use in a number of different application fields for different kinds of indications. In general, such devices have one row of light-emitting diodes, also known as a bar graph, and a control circuit to turn on individual light-emitting diodes. For this purpose, the control circuit has address outputs connected to position inputs on the row of light-emitting diodes.

One problem is that an undetected fault could occur, for example, a short-circuit between two lines, since the display does not change very much. The nearest diode neighbor then 20 lights as well, which is not necessarily interpreted as a fault. In addition, an undetected erroneous indication could have consequences, such as for example termination of a process at the wrong point or operation of a process with an incorrect parameter value, such as temperature, etc.

SUMMARY OF THE INVENTION

It is an object of the present invention to provide a device of the general type described above, which provides a clear indication of any faults which may occur.

The above object is achieved in accordance with the principles of the present invention by inter-connection of the address outputs of the control circuit and the position inputs of the light-emitting diodes in such a way that two adjacent address outputs are hard-wired connected to two position inputs physically separated by at least one position input.

Accordingly, the normal display format is distorted when a fault occurs so the row of light-emitting diodes shows that a fault is present. Especially when the intended indication is only at the parameter value with one or a few light-emitting diodes and not in the form of an illuminated bar, the special connection between the address outputs and the position inputs ensures that a fault can be quickly identified. Indication only at the parameter value also has the additional advantage of reducing the power requirements of the device.

In an embodiment of the invention at least two parameter values are displayed in the row of light-emitting diodes, such as a reference value and an actual value, and the control circuit causes display of the respective parameter values with different illumination modes, such as continuously lit diodes, diodes lit with different intensities for different parameter values, blinking diodes, different blink rates and/or blinking at different levels for different parameters or different numbers of light-emitting diodes in the illumination modes. This can be accomplished by appropriate modulation of the electrical signals supplied to the address outputs.

The use of a plurality of different indications in the same row of light-emitting diodes saves space. The different values are distinguished by the use of different illumination modes, such as continuous lighting at one intensity, blinking on and off, blinking at different intensities, different colors, different numbers of light-emitting diodes in the illumination modes etc.

The device can be equipped with a parameter value scale parallel to the row of light-emitting diodes in order to indicate the magnitude of a parameter value.

A linear parameter value scale is normally sufficient, but indication in a large parameter value range using one light-emitting diode row may be useful in certain instances. To emphasize a specific interval in this range, it would be advantageous to have a partially high-resolution parameter value scale, in which each scale segment or the distance between two light-emitting diodes in the most interesting parameter value intervals corresponds to a smaller value than in other intervals in which the same accuracy is not required for the parameter value. In other instances, a non-linear parameter value scale might be more useful, e.g. a logarithmic or quadratic scale.

In another embodiment of the invention, two parallel rows of light-emitting diodes are employed, these light-emitting diodes forming a matrix with one x coordinate and one y coordinate comprising each position input, and the address outputs of the control circuit each comprising one X coordinate and one Y coordinate. The address outputs and the position inputs are connected so that two adjacent X coordinate addresses are connected to two x coordinate positions separated by at least one x coordinate position and so that two adjacent Y coordinate addresses are connected to two y coordinate positions separated by at least one y coordinate position. In other words, no two adjacent X coordinate addresses will be physically connected to x coordinate positions which are adjacent, and no two adjacent Y coordinate addresses will be physically connected to y coordinate positions which are adjacent.

The use of two rows of light-emitting diodes increases the number of possible parameters which can be displayed simultaneously without any risk of mixup and without increasing the risk of misinterpreting a fault indication. The matrix system reduces the number of connecting lines between the control circuit and the row of light-emitting diodes. Each X coordinate constitutes, for example, part of an address output or a position input for every individual Y coordinate. The intersection of both x and y coordinate lines ensures that there is at least one empty row of light-emitting diodes on both sides of the indicated symbol.

Analogous to the description above regarding the use of different illumination modes in conjunction with the indication of two parameter values, the first parameter value can now be indicated with two adjacent light-emitting diodes which emit light at a fixed intensity, and the second parameter value can be indicated with the alternating blinking of two adjacent light-emitting diodes. Again, this can be accomplished by modulating the respective electrical signals supplied to the address outputs.

In another embodiment of the control circuit only energizes one light-emitting diode at a time, the time elapsing from the energization of one light-emitting diode until it is reenergized being so brief that the light-emitting diode appears to remain continuously lit, and the intensity with which a light-emitting diode driven in this manner appears to emit light depends on how often it is addressed and how long it remains lit in the time interval when addressed.

Lighting only one light-emitting diode at a time further reduces power consumption. Control of the intensity also ensures that intensity increases and any fault is discovered if a short-circuit should occur between two normally lit diodes.

The device according to the invention is not limited to the display of only one parameter. A plurality of rows of parameter value light-emitting diodes can be added to the system and controlled by the control circuit.

In order to increase the system's reliability even further, the control circuit can contain a parity check circuit which checks to ensure that the signal generated in the control circuit to light a specific light-emitting diode is correct. The parity check circuit can block the emission of the signal and keep the light-emitting diodes turned off if a fault occurred.

One advantageous employment of the device is as an indicator on a ventilator.

The correct display of values is particularly important with a ventilator. The safety of a connected patient depends on the administration of gas at a specific pressure and flow rate, correct gas composition etc. If any parameter is indicated erroneously and the error is not detected, there is a risk an attendant changing a parameter setting in the belief that the setting is incorrect. This change could have grave consequences for the patient.

Parameters have hitherto been displayed with analog dials or digital numerical displays. Analog instruments are incapable of displaying many values at the same time. One dial for the actual value and one dial for the reference value or an alarm level are normal. More dials increase the difficulty in making correct readings. In addition, the reference value or alarm level must be set manually on analog instruments. Digital numerical displays can only indicate one value at a time. Thus a plurality of displays must be used when a plurality of values have to be displayed or the displays must be resettable to permit indication of other values. Moreover, a fault in the indication device could result in the display of an erroneous numerical value. A break in one line could cause, for example, an 8 to be displayed as a 0.

With use of the device according to the present invention, a plurality of values can be indicated and read easily and simultaneously, since the risk of erroneous indications has been minimized.

DESCRIPTION OF THE PREFERRED EMBODIMENTS

Figure 1:
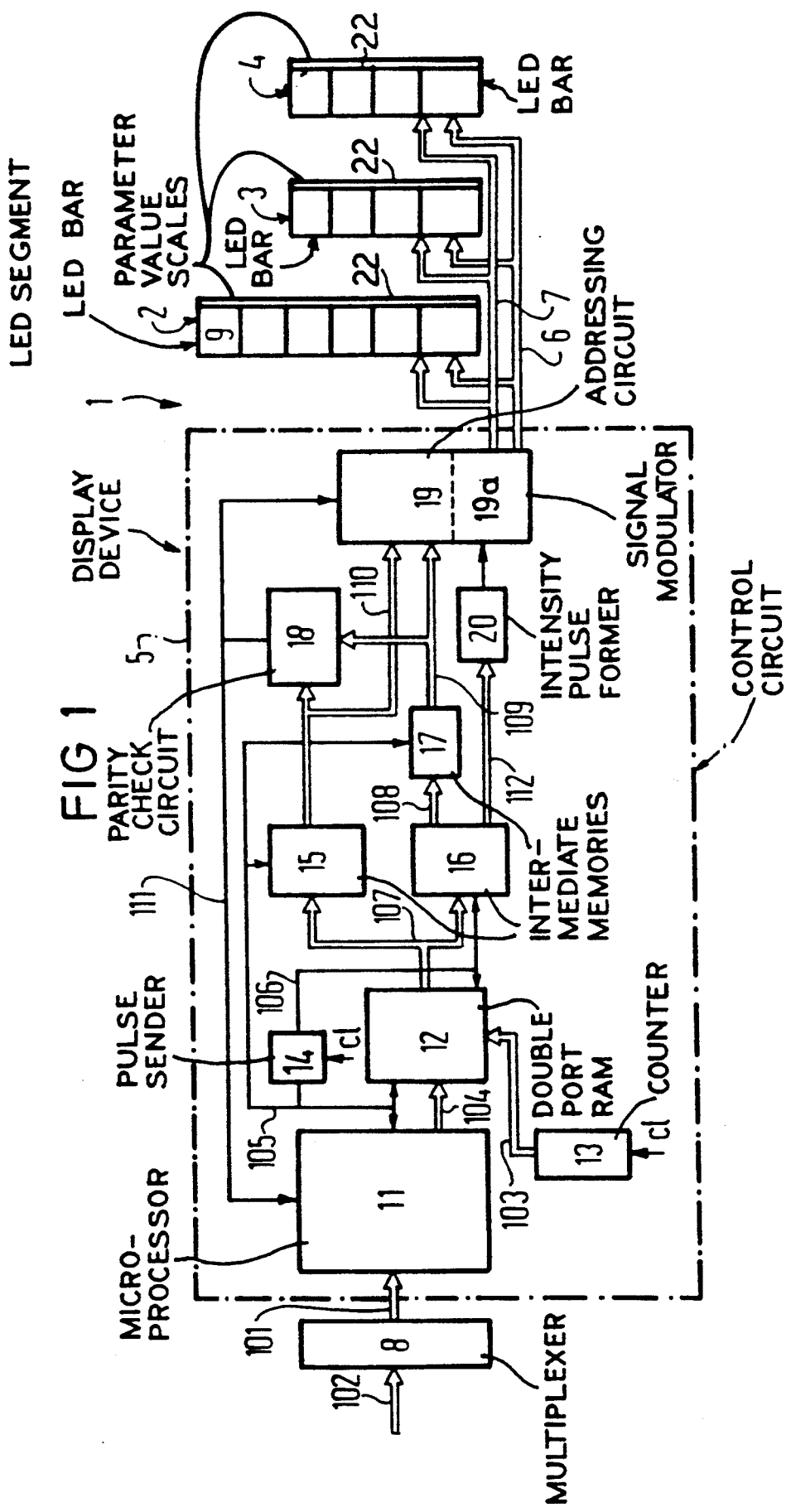
FIG. 1 is a schematic block diagram of a device for displaying a parameter value constructed in accordance with the principles of the present invention.

In the case of ventilators, obtaining information about, for example, pressure and volume must be fast and easy. The information must be readily accessible, and detection of any faults must be simple. FIG. 1 shows a device 1 for this purpose in accordance with the invention. Device 1 includes a first light-emitting diode bar 2 for indication of pressure, a second light-emitting diode bar 3 for low-resolution indication of volume, a third light-emitting diode bar 4 for high-resolution indication of volume, and a control circuit 5. The control circuit 5 is connected to the three light-emitting diode bars 2, 3, 4 by an X coordinate address data bus 6 and a Y coordinate address data bus 7 which are described in greater detail below.

A multiplexer 8 supplies the control circuit 5 with parameter values for pressure and volume via a data bus 101. The multiplexer 8 sends the two actual values to the ventilator as well as the reference value and alarm levels which have been set. Data flow to the multiplexer 8 is via a data bus 102.

In the control circuit 5 the data bus 101 is connected to a microprocessor 11 in which each parameter value is processed and transformed into a data instruction which consists of two bytes, one odd and one even, for each light-emitting diode which is to be lit, and which contains the address, intensity level and parity check bits. The data instruction is sent from the microprocessor 11 to a double port RAM 12 (DPR) via the data bus 104. The data instruction is fetched from the data output f the DPR 12 in two stages, controlled by a pulse sender 14. The pulse sender 14 controls the switching between the two addresses for the respective odd and even bytes in the DPR 12 and also controls transmission to first and second intermediate level memories 15 and 16. A counter 13 controls the transmission of each new data instruction from the DPR 12. The counter 13 and pulse sender 14 are clocked by a clock signal cl at a rate of, for example, 15.625 Hz, i.e. a period duration of 64 $\mu$s. When the counter 13 addresses data transmission from the DPR 12 at the beginning of a period via the data bus 103, the pulse sender 14 emits a negative pulse with a duration of 8 $\mu$s through a first signal line 105 and also emits a negative pulse with a duration of 4 $\mu$s through a second signal line 106. The first signal line 105 connects the pulse sender 14 to the microprocessor 11, the DPR 12, the first intermediate level memory 15 and a third intermediate level memory 17. The second signal line 106 connects the pulse sender 14 to the DPR 12 and the second intermediate level memory 16. The connection between the pulse sender 14 and the microprocessor 11 is to enable the microprocessor to synchronize transmission of the data instruction to the DPR 12 via the data bus 104.

When the positive-going edge of the signal in the second signal line 106 appears, i.e. 4 $\mu$s into the period, the even byte from the data output of the DPR 12 is transmitted via the data bus 107 to the second intermediate level memory 16 which is also activated by the positive-going edge. The DPR 12 is simultaneously re-switched in order to emit the odd byte from its data output.

Eight $\mu$s into the period, the positive-going edge of the signal appears at the first signal line 105, and the odd byte is sent to the first intermediate level memory 15 at the same time as the four lowest bits in the second intermediate level memory 16 are sent to the third intermediate level memory 17 via the data bus 108. These four bits, plus the sixth bit in the odd byte, constitute the X coordinate information, whereas the four highest bits in the even byte constitute the intensity 5 information.

The third intermediate level memory is connected via a data bus 109 to a parity check circuit 18 and an addressing circuit 19 to which the four bits are sent. The address in circuit 19 may contain a signal modulator 19a, if needed, to modulate the electrical signals supplied via the respective data lines to the light-emitting diode bars 2, 3 and 4 to provide the different illumination modes. This function could alternatively be undertaken in the microprocessor 11.

The odd byte, in which the five lowest bits constitute the Y coordinate information is sent to the parity check circuit 18. The sixth bit constitutes a part of the X coordinate information, as noted above, and the two highest bits constitute special purity bits used for the parity check. If a parity error occurs, the parity check circuit 18 sends a signal via the signal line 111 to the microprocessor 11 and to the addressing circuit 19. All light-emitting diodes will then be turned off. This prevents the overloading and destruction of individual light-emitting diodes if the same light-emitting diode is addressed continuously due to some fault in the data instruction. The light-emitting diodes re-light as soon as all the information in the DPR 12 is correct.

The four bits in the even byte which constitute the intensity information are sent from the second intermediate level memory 16 via a data bus 112 to an 30 intensity pulse former 20. Intensity information is transformation in the intensity pulse former 20 into a pulse whose width designates the time the light-emitting diode is to be lit during the period. The pulse width can vary, for example, from 0 to 56 μs, 56 μs constituting maximum 35 intensity. The intensity pulse is sent to the addressing circuit 19 via a signal line 113.

X and Y coordinate information is read in the addressing circuit 19, and a signal is sent to the respective coordinate address bus 6 or 7 to light the addressed light-emitting diode for the duration of the intensity pulse.

When this period has elapsed, the counter 13 is incremented by one step so as to address the next byte pair identifying a new light-emitting diode. With, for example, a 7-bit counter, 64 light-emitting diodes can be addressed in one cycle, the first light-emitting diode thereafter being addressed once again. The cycle period could also consist of six or eight or some other number of bits, and the same light-emitting diode could be addressed many times during a cycle in order to increase the intensity.

A parameter value scale 22 is disposed next to each light-emitting diode bar 2, 3 and 4 to permit the numerical values for pressure and volume respectively to be read.

Figure 2:
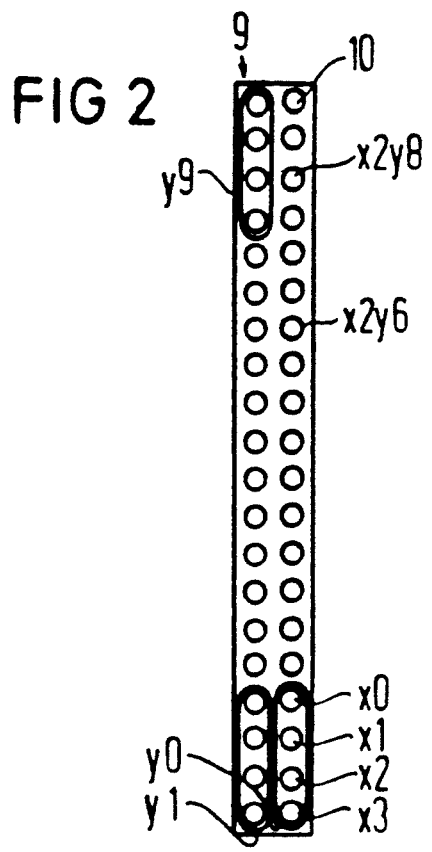
FIG. 2 shows one light-emitting diode segment in the device of FIG. 1.

As FIG. 1 shows, the light-emitting diode bars 2, 3 and 4 each consist of a number of light-emitting diode segments 9. FIG. 2 shows one of these light-emitting diode segments 9. The light-emitting diode segment 9 consists of forty light-emitting diodes 10, each having a unique position coordinate in the light-emitting diode segment 9, as shown in FIG. 2.

The light-emitting diodes 10 are sub-divided into ten y coordinate groups, y0 to y9, each having four x coordinates, x0 to x3. In principle, each individual light-emitting diode 10 could have its own signal line, but the total number of lines can be reduced with a coordinate system, i.e. from forty to fourteen lines in this instance.

Figure 3:
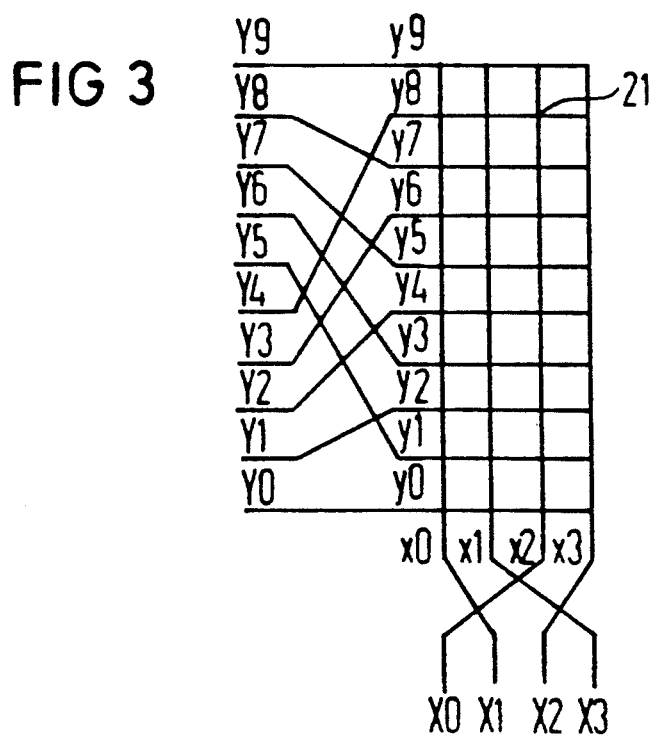
FIG. 3 is a schematic representation of the light-emitting diode bar of FIG. 2 in matrix form, in accordance with the principles of the present invention.

FIG. 3 shows the light-emitting diode bar 9 in matrix form to illustrate the manner in which fault indication is performed according to the invention. The positions are indicated with lower case letters and addresses with upper case letters. Each intersection 21 of two position lines corresponds to a light-emitting diode, and each combination of an x and a y coordinate constitutes a position input for the light-emitting diode at the intersection of the two coordinates.

As FIG. 3 shows, an address coordinate X0, for example, has been connected (hard-wired) to the position coordinate x2, address coordinate X1 to position coordinate x0, X2 to x3 etc.

If a short-circuit should occur between two address coordinates, for example, Y3 and Y4, a signal on either of the lines will also lead to transmission of the signal to the second line via the short-circuit point. A signal to light a light-emitting diode via the address coordinate XOY4 also results in a signal with the address coordinate XOY3. In FIG. 2, the position coordinate x2y8, which is lit by the address coordinate XOY4, has been identified. The address coordinate XOY3 lights the position coordinate x2y6, also identified in FIG. 2. It can be seen that there are three rows of light-emitting diodes between the two positions. This discrepancy would be quickly interpreted as a fault.

In principle, the cross-connection of the address and position coordinates can be achieved in any way. It is essential that two adjacent address coordinates must not be connected to two adjacent position coordinates. As FIG. 1 shows, the first light-emitting diode bar 2 consists of six light-emitting diode segments 9, and each of the second and third light-emitting diode bars 3 and 4 consists of four light-emitting diode segments 9, i.e. a total of fourteen light-emitting diode segments 9 which are addressed by the control circuit 5.

If each light-emitting diode segment 9 were to be addressed individually, 14×14 lines would be required (FIG. 3 shows that one light-emitting diode segment 9 requires fourteen lines), i.e. 196 lines, 140 Y address lines and 56 X address lines. By having the same coordinates address a plurality of light-emitting diode segments 9, the number of lines can be reduced. With, for example, three groups of ten Y address coordinates (Y0–Y9, Y10–Y19, Y20–Y29) and five groups of four X address coordinates (X0–X3, X4–X7, X8–X11, X12–X15, X16–X18), fifteen unique sets of addresses can be combined by having each X address coordinate group constitute a part of the address in combination with each Y coordinate group. This is sufficient for addressing any individual light-emitting diode in one of fifteen light-emitting diode segments, each comprising forty light-emitting diodes. In this example, there are fifty lines from the control circuit 5, thus a 146-line reduction.

Figure 4:
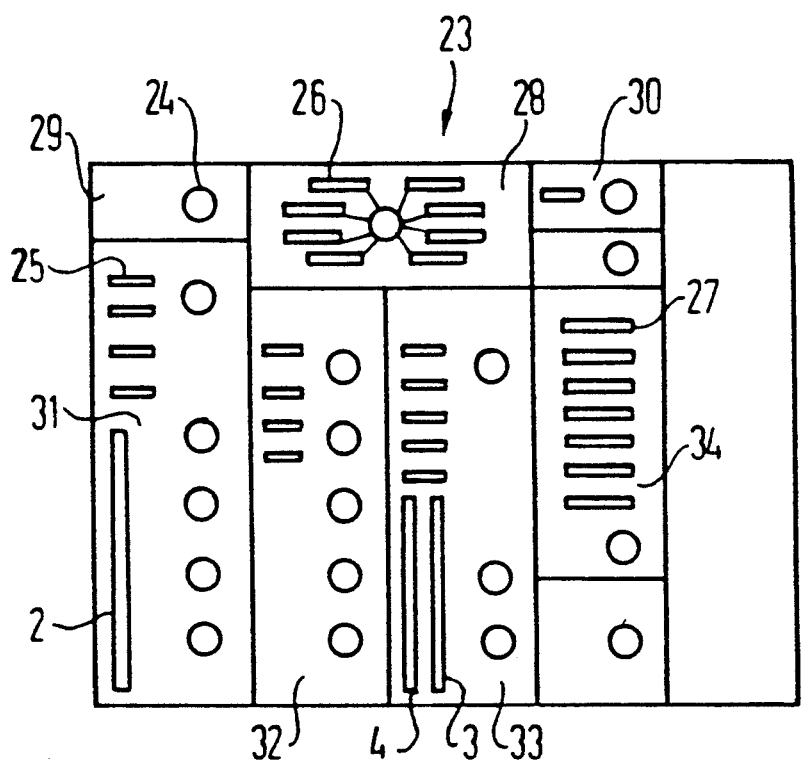
FIG. 4 is a schematic representation of the front of a control unit for a ventilator in which the device of FIGS. 1-3 is installed.

FIG. 4 shows the front of a control unit 23 for the ventilator in which the device according to FIGS. 1–3 is installed. The control unit 23 is divided into different function fields 28 to 34 with setting knobs 24, light-emitting diode displays 25, setting indicators 26, alarm indicators 27 and light-emitting diode bars 2, 3 and 4. The function of the various designated function fields 28 to 34 is as follows. The ventilator's operating mode is set in function field 28, the patient type, i.e. whether the patient is an adult, child or infant, is set in function field 29, oxygen concentration is set in function field 30, pressure is set in function field 31, flow rate is set in function field 32, volume is set in function field 33 and function field 34 indicates errors which can occur in the ventilator. Pressure is thus displayed by light-emitting diode bar 2 in function field 31 and high and low resolution volumes are displayed by light-emitting diode bars 3 and 4 in function field 33, in the manner described above.

Although modifications and changes may be suggested by those skilled in the art, it is the intention of the inventors to embody within the patent warranted hereon all changes and modifications as reasonably and properly come within the scope of their contribution to the art.

We claim:

1. A device for displaying a parameter value comprising:
    a row of light-emitting diodes, each light-emitting diode having a position input;
    control means, having a plurality of address outputs respectively uniquely allocated to the light-emitting diodes in said row, for illuminating selected ones of said light-emitting diodes, to display a parameter value supplied to said control means, by supplying an electrical signal to the address outputs respectively allocated to said selected light-emitting diodes; and
    hard-wired interconnection means, electrically connecting said address outputs and said position inputs with no two adjacent address outputs being respectively physically connected to two position inputs for light-emitting diodes which are adjacent in said row, for causing an immediately perceptible distortion in the display of said parameter value in the presence of a faulty illumination of one of said light-emitting diodes for permitting immediate identification of a fault in the display of said parameter value.

2. A device as claimed in claim 1 further comprising:
    means in said control means for displaying two of said parameter values by supplying electrical signals to two sets of address outputs respectively corresponding to said two parameters; and
    means in said control means for modifying said electrical signals so that two sets of said light-emitting diodes, having position inputs respectively allocated to said two sets of address outputs, are illuminated with different illumination modes.

3. A device as claimed in claim 2 wherein said different illumination modes are continuously lighting all light-emitting diodes in one of said light-emitting diode sets and blinking the light-emitting diodes in the other of said light-emitting diode sets.

4. A device as claimed in claim 2 wherein said different illumination modes are illuminating the light-emitting diodes in the respective light-emitting diode sets with different intensities.

5. A device as claimed in claim 2 wherein said different illumination modes are blinking the light-emitting diodes in the respective light-emitting diode sets at different blink rates.

6. A device as claimed in claim 2 wherein said different illumination modes are blinking the light-emitting diodes in the respective light-emitting diode sets at different intensity levels.

7. A device as claimed in claim 1 further comprising a parameter value scale disposed next to said row of light-emitting diodes.

8. A device as claimed in claim 7 wherein said parameter value scale is a non-linear parameter value scale.

9. A device as claimed in claim 1 further comprising:
    a further row of light-emitting diodes disposed next to and parallel to said row of light-emitting diodes, said light-emitting diodes in said row and in said further row, in combination, forming a matrix with each light-emitting diode having a position input consisting of one x coordinate and one y coordinate identifying the location of that light-emitting diode in said matrix;
    said address outputs of said control means each comprising one X coordinate and one Y coordinate; and
    wherein said interconnection means is a means for electrically connecting said address outputs and said position inputs so that any two adjacent X coordinate address outputs are respectively connected to two x coordinate position inputs separated by at least one x coordinate position and so that any two adjacent Y coordinate address outputs are respectively connected to two y coordinate position inputs separated by at least one y coordinate position.

10. A device as claimed in claim 9 wherein said control means includes means for supplying said electrical signals to two sets of said address outputs for illuminating two selected sets of said light-emitting diodes in said matrix to display two parameter values, and further comprising means in said control means for modulating said electrical signals so that said sets of light-emitting diodes are respectively illuminated with different illumination modes.

11. A device as claimed in claim 10 wherein said different illumination modes are indicating a first of said two parameters by adjacent light-emitting diodes illuminated with a fixed intensity, and a second of said two parameter values is indicated with alternating blinking of two adjacent light-emitting diodes.

12. A device as claimed in claim 1 wherein said control means is a means for illuminating only one of said light-emitting diodes at a time, and further comprising means for modulating the electrical signal for said one light-emitting diode so that said one light-emitting diode is alternatingly energized and de-energized at a rate so that said one light-emitting diode has a visual appearance of being continuously illuminated at an intensity, said intensity being dependent on the frequency with which said one light-emitting diode is addressed by said control means and the duration of illumination of said one light-emitting diode when addressed.

13. A device as claimed in claim 1 further comprising:
    a further row of light-emitting diodes, separated from said row of light-emitting diodes, each light-emitting diode in said further row having a position input;
    said control means having a further plurality of address outputs respectively uniquely allocated to the light-emitting diodes in said further row, for illuminating selected ones of said light-emitting diodes in said further row, to indicate a further parameter value supplied to said control means, by supplying further electrical signals to the further additional outputs respectively allocated to the selected light-emitting diodes in said further row, said control means separately controlling said row and said further row of light-emitting diodes; and
    further interconnection means for electrically connecting said further address outputs and said position inputs of said further light-emitting diodes with no two adjacent further address outputs being respectively connected to two position outputs for light-emitting diodes which are adjacent in said further row.

14. A device as claimed in claim 1 further comprising parity check means in said control means for checking to ensure that said electrical signal correctly corresponds to address outputs for illuminating selected light-emitting diodes correctly corresponding to said parameter value and for blocking emission of said electrical signal in the event of a fault.

15. A device as claimed in claim 1 further comprising ventilator means for supplying said parameter value to said control means.

16. A device as claimed in claim 15 wherein said ventilator means is a means for supplying at least one parameter value to said control means corresponding to at least one of gas pressure, gas flow, gas volume and gas concentration.

* * * * *